United States Patent
Sheffield et al.

[11] Patent Number: 5,907,510
[45] Date of Patent: May 25, 1999

[54] WRITE BIAS GENERATOR FOR COLUMN MULTIPLEXED STATIC RANDOM ACCESS MEMORY

[75] Inventors: Bryan D. Sheffield, Allen; John D. Drummond, Wylie, both of Tex.

[73] Assignee: Texas Instruments Incorporated, Dallas, Tex.

[21] Appl. No.: 09/002,275

[22] Filed: Dec. 31, 1997

Related U.S. Application Data

[60] Provisional application No. 60/034,639, Jan. 3, 1997.

[51] Int. Cl.$^6$ .............................. G11C 7/00; G11C 11/00
[52] U.S. Cl. ...................... 365/189.09; 365/154; 365/156
[58] Field of Search ............................... 365/189.09, 154, 365/156

[56] References Cited

U.S. PATENT DOCUMENTS 4,764,899  8/1988  Lewallen et al. ................... 365/189.11
5,276,647  1/1994  Matsui et al. ....................... 365/189.11

*Primary Examiner*—David Nelms
*Assistant Examiner*—Trong Phan
*Attorney, Agent, or Firm*—Robert D. Marshall, Jr.; James C. Kesterson; Richard L. Donaldson

[57] ABSTRACT

This invention is useful in column multiplexed memories, particularly static random access memories (SRAM) used in application specific integrated circuits (ASIC). These column multiplexed memories include memory cells disposed in rows and columns. For writes all the bitlines are connected to a bias generator. The bias generator uses first P-channel field effect transistor and a first N-channel field effect transistor connected in series with their junction connected to the bitline. The bias generator is driven by a bias enable pulse that is active for a short time before the write time. Normally these field effect transistors are biased OFF by a second P-channel field effect transistor and a second N-channel field effect transistor. Another pair of N-channel field effect transistors connect the bases of the first P-channel field effect transistor and the first N-channel field effect transistor together to the bitline when the bias enable pulse is active. The first P-channel field effect transistor and the first N-channel field effect transistor are constructed with a ratio of channel widths equal to the ratio of the P-channel and N-channel field effect transistors in an input inverter of the latch of the memory cell. The second P-channel field effect transistor has a channel width much greater than the channel width of the second N-channel field effect transistor.

9 Claims, 2 Drawing Sheets

WRITE BIAS GENERATOR FOR COLUMN MULTIPLEXED STATIC RANDOM ACCESS MEMORY

This application claims priority under 35 USC § 119(e)(1) of provisional application No. 60/034,639 filed Jan. 3, 1997.

TECHNICAL FIELD OF THE INVENTION

The technical field of this invention is write bias generators for column multiplexed static random access memories.

BACKGROUND OF THE INVENTION

This invention concerns write bias generators for column multiplexed static random access memories (SRAM). Often the logical layout of SRAM's is not optimum for performance. Where the number of words greatly exceeds the number of bits per word, the layout becomes a thin rectangle. This results in very long column lines. These long column lines have a large capacitance compared with shorter lines, thus requiring more power to drive. Minimization of both the word lines and the column lines requires a more compact layout. This more compact layout is typically achieved using column multiplexing. In column multiplexing, the wordlines enable corresponding rows including plural columns, however, only some of the column bitlines are used. The bitline selection is made via one or more of the address lines.

Memory cells with single ended write ports have an inherent problem when used in a column multiplexed layout. During writes an entire row of memory cells are enabled. Only a single column bitline should be active in order to select the proper memory cell. All the other column bitlines must be left floating. The column bitlines have a capacitance that may store a charge from previous writes. Depending on the conditions, this prior charge may accidentally overwrite memory cells 10 in an unselected column. It is known in the art to bias all the column bitlines to a safe voltage to prevent the memory cells of the unselected columns from being written to due to charge left on the bitline. A bias generator supplies a safe voltage to a corresponding column bitline. This voltage is preferably in the region between the two switching thresholds of the memory cell.

SUMMARY OF THE INVENTION

This invention is useful in column multiplexed memories, particularly static random access memories (SRAM) used in application specific integrated circuits (ASIC). These column multiplexed memories include memory cells disposed in rows and columns. Each memory cell includes a latch consisting of a pair of cross-connected inverters for storing a data bit. A word address decoder receives a predetermined set of most significant address bits and activates the word lines of a corresponding single row of memory cells. There is a column selector for each set of multiplexed columns. The column selector receives the least significant address bits and activates a corresponding bitline for reads and writes.

For writes all the bitlines are connected to a bias generator. The bias generator provides a predetermined bias voltage to prevent switching of memory cells activated by the selected wordline but connected to the unselected bitlines. The bias generator also preconditions the selected bitline to the center of the write switching thresholds of the memory cells. This bias generator uses a first P-channel field effect transistor and a first N-channel field effect transistor connected in series with their junction connected to the bitline. The bias generator is driven by a bias enable pulse that is active for a short time before the write time. Normally these field effect transistors are biased OFF. This presents a high impedance to the bitline. A second P-channel field effect transistor shorts the gate of the first P-channel field effect transistor to the supply voltage cutting it off when the bias enable pulse is inactive. A second N-channel field effect transistor shorts the gate of the first N-channel field effect transistor to ground cutting it off when the bias enable pulse is inactive. Another pair of N-channel field effect transistors connect the gates of the first P-channel field effect transistor and the first N-channel field effect transistor together to the bitline when the bias enable pulse is active. This forms an inverter having its input shorted to its output.

The first P-channel field effect transistor and the first N-channel field effect transistor are constructed with a predetermined ratio of channel widths. The ratio is equal to the ratio of the P-channel and N-channel field effect transistors in an input inverter of the latch of the memory cell. This similarity in construction ensures that the bias voltage properly tracks the switching points of the memory cells under differing temperature and supply voltage conditions.

The second P-channel field effect transistor and the additional pair of N-channel field effect transistors are driven through an inverter receiving the bias enable pulse. The second N-channel field effect transistor is directly driven by the bias enable pulse. The additional pair of N-channel field effect transistors each have a channel width much greater than the channel width of the second N-channel field effect transistor. This prevents the second N-channel field effect transistor from turning off the first N-channel field effect transistor before the end of the inverter delay. This enables the first P-channel field effect transistor and the first N-channel field effect transistor to turn off simultaneously at the end of the active bias enable pulse. Such simultaneous turn off prevents one of these two field effect transistors from substantially shifting the bias voltage when turning off.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
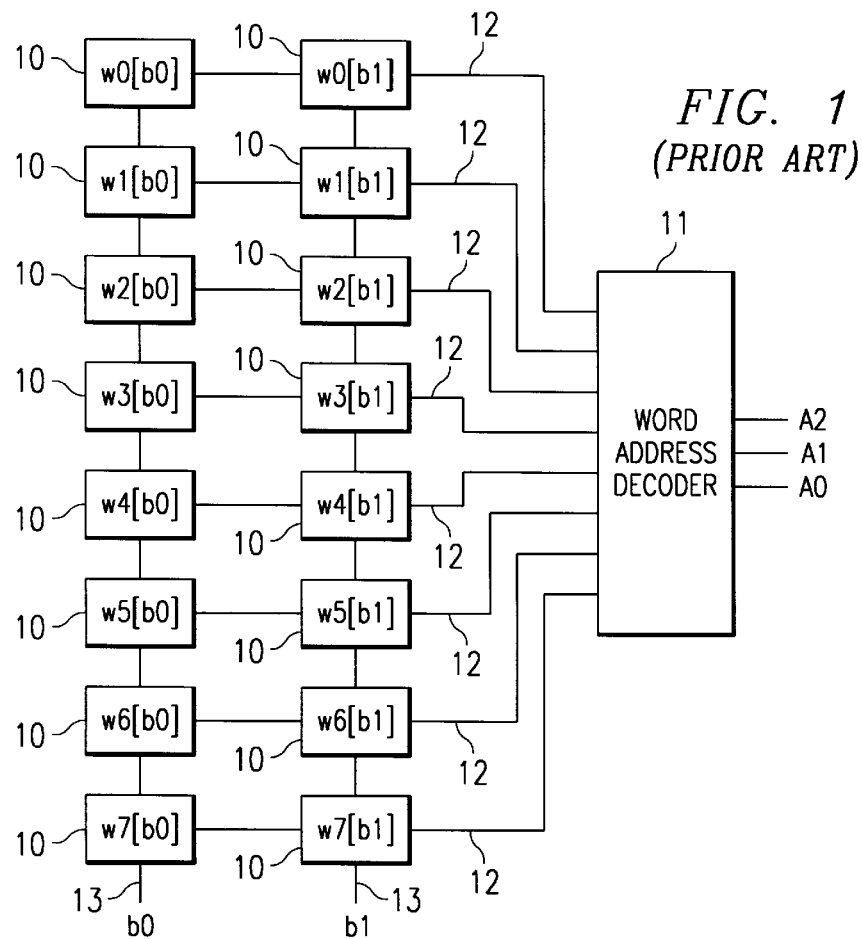
FIG. 1 illustrates the physical layout of an example of a static random access memory with few columns and many rows according to the prior art.

This invention concerns write bias generators for column multiplexed static random access memories (SRAM). FIG. 1 illustrates the physical layout of an illustrative example of an SRAM having plural words and plural bits per word. The example illustrated in FIG. 1 includes eight words w0 to w7, each including two bits b0 and b1. Conventionally, an SRAM for this number of words and bits per word is laid out as two columns of eight rows of memory cells 10. The two columns correspond to the two bits per word. The eight rows correspond to the eight words. FIG. 1 illustrates the word and bit assignments of each of these sixteen memory cells 10. The address of three bits A0 to A2 is supplied to word address decoder 11. Word address decoder 11 decodes the received address and generates a word select signal on one of the eight word lines 12. The active word line 12 activates one of the eight words w0 to w7. The read or write operation takes place via column bitlines 13.

Often the logical layout illustrated in FIG. 1 is not optimum for performance. Where the number of words greatly exceeds the number of bits per word, the layout becomes a thin rectangle. Such a memory shape is difficult or impossible to fit within the form factor of the integrated circuit including the SRAM. Accordingly, providing a better form factor requires a more compact layout than that of FIG. 1.

Figure 2:
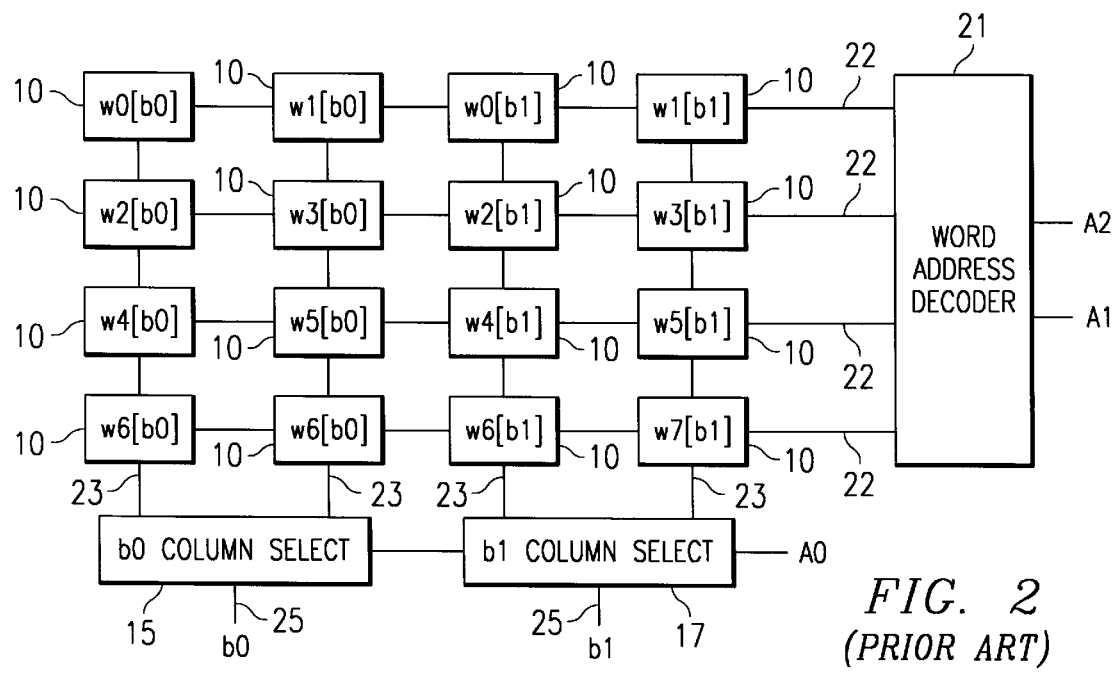
FIG. 2 illustrates the physical layout of an example of a static random access memory with the same logical dimensions as that illustrated in FIG. 1 employing column multiplexing according to the prior art.

FIG. 2 illustrates the physical layout of an illustrative example of an SRAM the column multiplexed type. This SRAM includes eight words (w0 to w7) of two bits (b0 and b1) each as shown in FIG. 1. However, the SRAM of FIG. 2 is laid out in a more compact form of 4 rows and 4 columns. FIG. 2 illustrates the word and bit assignments of each of the sixteen memory cells 10. The two left hand columns of memory cells 10 include the bit b0 for each of the eight words w0 to w7. The two right hand columns of memory cells 10 include the bit b1 for each of the eight words w0 to w7. The two most significant address bits A1 and A2 are supplied to word address decoder 21. Word address decoder 21 decodes the received most significant address bits and generates a word select signal on one of the four word lines 22. The active word line 22 activates an adjacent pair of the eight words w0 to w7 (w0 and w1, w2 and w3, w4 and w5 or w6 and w7). The read or write operation takes place via column bitlines 23. Each word line 22 is connected to memory cells 10 in four columns. The two left column bitlines 23 are connected to b0 column select 15. The b0 column select 15 receives the least significant address bit A0 and selects a corresponding one of the two left column bitlines 23. This is connected to multiplexed column line 25. Note that b0 column select 15 selects the first bit b0 of the accessed word. Similarly, the two right column bitlines 23 are connected to b1 column select 17. The b1 column select 17 receives the least significant address bit A0 and selects a corresponding one of the two right column bitlines 23. Thus b1 column select 17 selects the second bit b1 of the accessed word. The more compact layout of this example is more easily placed within the form factor of the integrated circuit including the SRAM.

The operation of b0 column select 15 and b1 column select 17 is controlled by the received least significant address bit of bits. Note that these select circuits could select between more than two column bitlines 23 using plural least significant address bits. During memory writes, all column bitlines 23 should be supplied with a bias voltage in a manner further explained below. Thereafter, the write voltage is supplied to the column bitline selected according to the least significant address bits. This process is known in the art.

Figure 3:
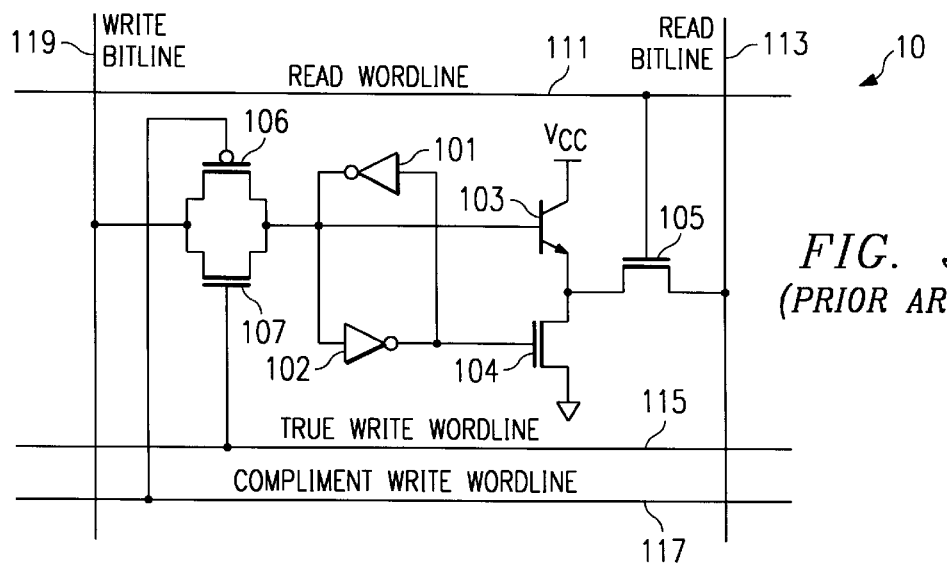
FIG. 3 illustrates in schematic form a typical static memory cell according to the prior art.

FIG. 3 illustrates an example of a two port SRAM memory cell 10 such as may be used in conjunction with this invention. Cross-connected inverters 101 and 102 latch the bit of memory cell 10. The NPN bipolar transistor 103 and field effect transistor 104 bias the source-drain path of field effect transistor 105 according to the state stored in the latch. During reads, read wordline 111 is active causing field effect transistor 105 to couple the state of the latch to read bitline 113. During writes true write wordline 115 turns on field effect transistor 106 and complement write wordline 117 turns on field effect transistor 107. These field effect transistors 106 and 107 form a pass gate coupling the latch to write bitline 119. Because there is a single write bitline 119, rather than complementary write bitlines, this structure is known as a single ended write port.

Memory cells with single ended write ports have an inherent problem when used in a column multiplexed layout. During writes, true write wordline 115 and complement write wordline 117 are enabled. Thus an entire row of memory cells 10 are enabled. Only a single column bitline should be active in order to select the proper memory cell 10. All the other column bitlines must be left floating. The column bitlines have a capacitance that may store a charge from previous writes. Depending on the conditions, this prior charge may accidentally overwrite memory cells 10 in an unselected column. It is known in the art to bias all the column bitlines to prevent the memory cells 10 of the unselected columns from being written to due to charge left on the bitline. A bias generator supplies a safe voltage to the corresponding column bitline. This voltage is preferably in the region between the two switching thresholds ("1" to "0" and "0" to "1") of the memory cell 10 latch.

There are several requirements for the bias generator. The bias generator must drive the write bitlines immediately preceding a write but not be active during the write. Thus the bias generator must bias the bitlines very quickly. It is typical to key the bias generator from a bias enable pulse keyed off the activating edge of the write enable signal. The bias generator must achieve the safe voltage and switch off to a high impedance state within a short interval. This implies high switch speed and large current capacity.

Figure 4:
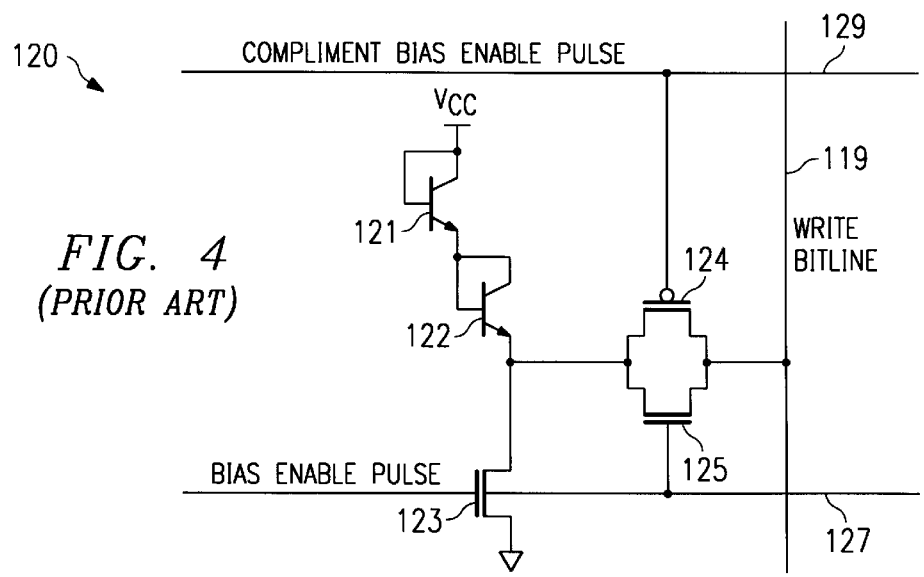
FIG. 4 illustrates in schematic form a prior proposed write bias generator for use with the column multiplexed static random access memory layout illustrated in FIG. 2 and the cell illustrated in FIG. 3.

FIG. 4 illustrates a prior proposed bias generator 120. The bias generator 120 includes a pair of NPN bipolar transistors 121 and 122 and a field effect transistor 123. When the bias enable pulse on line 127 is active, field effect transistor 123 conducts. This causes the two NPN bipolar transistors 121 and 122 to also conduct. This places a voltage dependent upon the supply voltage $V_{cc}$ at the node between NPN bipolar transistors 121 and 122 and field effect transistor 123. The bias enable pulse on line 127 causes field effect transistor 125 to conduct while the inverted signal on compliment bias enable pulse line 129 causes field effect transistor 124 to conduct. Field effect transistors 124 and 125 couple the voltage at the node between NPN bipolar transistors 121 and 122 and field effect transistor 123 to write bitline 119. This supplies the bias voltage to write bitline 119. This bias voltage is set by the forward bias voltage drop of the two NPN bipolar transistors 121 and 122 and the supply voltage $V_{cc}$.

Bias generator 120 operates rapidly due to the strong pull up characteristic of the two NPN bipolar transistors 121 and 122. The pass gate formed of the two field effect transistors 124 and 125 provides the required isolation from write bitline 119 at the end of the bias enable pulse. Thus bias generator 120 appears to meet the minimum requirements.

Bias generator 120 has several problems. The bias generator 120 has a large input capacitance. Because one bias generator 120 is required for each column, this presents a problem driving the bias enable pulse line 127 and the compliment bias enable pulse line 129. Bias generator 120 requires both a bias enable pulse and a compliment bias enable pulse, thus using more horizontal routing space on the integrated circuit including the SRAM. A pass gate consisting of field effect transistors 124 and 125 is needed to achieve a high impedance off state. This pass gate tends to increase the bias generator output resistance and decrease the biasing strength. These two factors are disadvantageous. This circuit tends to use more electric power than desirable.

The most bothersome problem with bias generator 120 is its change of bias voltage with changes in environmental conditions. The bias voltage changes differently than the threshold voltages of inverter 102 with changes in supply voltage $V_{cc}$ and changes in temperature. The bias voltage of bias generator 120 is tied to the supply voltage $V_{cc}$ and remains a fixed offset equal to two forward biased diode drops below that voltage. In contrast, the switching threshold of inverter 102 depends on the ratio of size of the P channel and the N channel field effect transistors forming inverter 102. This tracks roughly one half of the change in supply voltage $V_{cc}$. The bias voltage of bias generator 120 generally changes directly proportional to temperature. As the temperature rises, NPN bipolar transistors 121 and 122 conduct more strongly and their forward bias voltage drop decreases. At the same time, increased temperature causes field effect transistor 123 to be less conductive. These changes cause the bias voltage to increase to nearer the supply voltage $V_{cc}$ for increasing temperature. The reverse happens for decreasing temperatures. The input threshold of inverter 102 remains nearly the same over a wide temperature range. As a consequence of these differing changes with changes in supply voltage $V_{cc}$ and temperature, bias generator 120 may operate properly for ideal design conditions but does not provide the necessary bias voltage at other conditions within a desired range.

Figure 5:
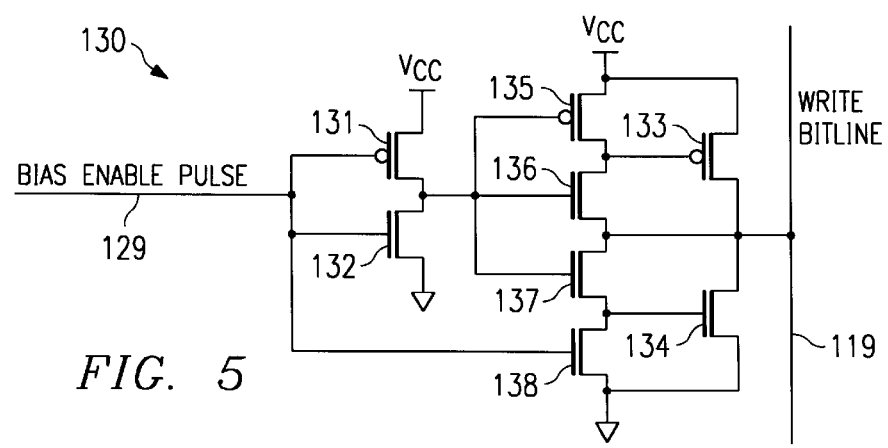
FIG. 5 illustrates in schematic form the write bias generator of this invention.

FIG. 5 illustrates the bias generator 130 according to a preferred embodiment of this invention. The bias enable pulse on line 129 supplies the input to an inverter consisting of field effect transistors 131 and 132. The inverter output supplies the gate voltage to field effect transistors 135, 136 and 137. Field effect transistor 138 is biased by the bias enable pulse directly. Field effect transistors 133 and 134 provide the required bias voltage on write bitline 119.

The bias generator 130 operates as follows. The bias enable pulse on line 129 is a low active signal. When the bias enable pulse on line 129 is an inactive high, field effect transistors 135 and 138 are turned on. Field effect transistor 135 pulls the gate of field effect transistor 133 up to the supply voltage $V_{cc}$. Thus field effect transistor 133 is turned off. Field effect transistor 138 pulls the gate of field effect transistor 134 down toward ground. Thus field effect transistor 134 is cut off. At the same time both field effect transistors 136 and 137 are turned off by the low voltage from the output of the inverter formed by field effect transistors 131 and 132. In this state bias generator 130 isolates write bitline 119 from both the supply voltage $V_{cc}$ and ground. This presents the required high impedance to write bitline 119. Because this circuit naturally isolates write bitline 119 when turned off, there is no need for a pass gate at the output such as illustrated in FIG. 3. This reduces the output impedance and increases the biasing strength. This also eliminates the need to supply a complement bias enable pulse, as would be required by a pass gate. Thus bias generator 130 using less horizontal routing space than bias generator 120.

When the bias enable pulse on line 129 is an active low, field effect transistors 135 and 138 turn off. At the same time the output of the inverter formed by field effect transistors 131 and 132, turns field effect transistors 136 and 137 on. This couples field effect transistors 133 and 134 into an inverter configuration with the input connected to the output. The voltage at the output is dependent upon the ratio of channel widths of field effect transistors 133 and 134. In the preferred embodiment, field effect transistors 133 and 134 are constructed to have the same channel width ratio as the field effect transistors of inverter 102 of memory cell 10 illustrated in FIG. 3. With this selection, the bias voltage is the center of the region between switching thresholds of inverter 102. This is exactly the desired bias voltage. Because field effect transistors 133 and 134 are of the same type as employed in inverter 102, the bias voltage produced by bias generator 130 will change with changes in environmental conditions the same as the switching thresholds.

The channel widths between field effect transistors 135, 136, 137 and 138 are set by turn off considerations. Field effect transistors 133 and 134 have large channel widths for large driving capacity. The channel width ratio between field effect transistors 135 and 138 are determined by a desire to obtain a nearly equal turn off slew rate for field effect transistors 133 and 134. In the preferred embodiment the channel width ratio in inverter 102 of the latch of memory cells 10 require field effect transistor 133 to have a channel width about four and one half times that of field effect transistor 134. This produces a similar ratio of gate capacitances between field effect transistors 133 and 134. Thus field effect transistor 135 must conduct four and one half times more current than field effect transistor 138. In the particular integrated circuit fabrication process used in the preferred embodiment, P-channel conductivity is about one half that of N-channel conductivity. Thus the channel width of P-channel field effect transistor 135 is about nine times greater than the channel width of N-channel field effect transistor 138 in the preferred embodiment.

Additional turn off considerations determine the channel width ratio between N-channel field effect transistors 137 and 138. The bitline could be pulled off the desired voltage if field effect transistors 135 and 138 turn off at slightly different times. Field effect transistor 135 receives its gate voltage an inverter delay later than field transistor 138. Absent some care in selecting the channel widths of the field effect transistors, field effect transistor 134 would always turn off before field effect transistor 133. Thus field effect transistor 133 could pull the voltage on write bitline up during the time it is on and field effect transistor 134 is off. To reduce this problem, the channel width of field effect transistor 137 is selected to be much greater than the channel width of field effect transistor 138. During the inverter delay interval when P-channel field effect transistor 135 is off and N-channel field effect transistor 138 is on, field effect transistor 137 is on. Since the channel width of N-channel field effect transistor 137 is much greater than the channel width of N-channel field effect transistor 138, the voltage at the gate of N-channel field effect transistor 134 remains little changed. Thus N-channel field effect transistor 134 continues to conduct at nearly the same current as before the end of the bias enable pulse. At the end of the inverter delay, P-channel field effect transistor 135 turns on to bias P-channel field effect transistor 133 off. At the same time, N-channel field effect transistor 137 turns off and thus N-channel field effect transistor 138 is now unopposed in biasing N-channel field effect transistor 134 off. The selection of the ratio of channel widths between P-channel field effect transistor 135 and N-channel field effect transistor 138 provides about the same turn off slew. Note that this is only a problem for write bitlines with relatively little capacitance.

As the capacitance of the write bitline 119 increases, the amount of charge moved by such differences in turn off time causes smaller voltage shifts.

Bias generator 130 achieves fast biasing because field effect transistors 133 and 134 do not oppose each other initially. Suppose, for example, that write bitline 119 initially has the supply voltage $V_{cc}$. When bias generator 130 initiates field effect transistor 133 has little source-drain voltage. Field effect transistor 133 will not even begin to turn on until the voltage on write bitline 119 falls below the supply voltage $V_{cc}$ minus the P-channel threshold voltage of field effect transistor 133. Thus field effect transistor 134 initially pulls down the voltage on write bitline 133 unopposed. Even when field effect transistor 133 begins to conduct, its current will be much less that the current of field effect transistor 134 initially. A similar action occurs if the voltage on write bitline 119 is initially at ground. Field effect transistor 134 cannot conduct until the voltage on write bitline 119 becomes greater than the N-channel threshold voltage of field effect transistor 138.

The power consumed by bias generator 130 is about 60% of the power consumed by bias generator 120 illustrated in FIG. 4. When active, the gate voltage on field effect transistors 133 and 134 is about half of the supply voltage $V_{cc}$. This results in less conductivity than if the gate of field effect transistor 133 were connected to ground and the gate of field effect transistor 134 were connected to the supply voltage $V_{cc}$. Thus less power is consumed.

Table 1 lists the relative channel widths in accordance with the preferred embodiment.

TABLE 1

| FET | Relative Channel Width |
|---|---|
| 131 | 5.2 |
| 132 | 3.4 |
| 133 | 46.8 |
| 134 | 10.2 |
| 135 | 15.6 |
| 136 | 13.0 |
| 137 | 13.0 |
| 138 | 1.5 |

Note that the ratio between the channel width of P-channel field effect transistor 133 and the channel width of N-channel field effect transistor 134 is set by the channel width ratio of the inverter 102 in the latch of memory cell 10. The channel widths of P-channel field effect transistor 135 and N-channel field effect transistor 138 are selected to provide equal turn off slew of P-channel field effect transistor 133 and N-channel field effect transistor 134. The channel widths of N-channel field effect transistors 136 and 137 are selected for the desired turn on speed. At the same time the channel width of N-channel field effect transistor 137 is much greater than the channel width of N-channel field effect transistor 138 due to the turn off considerations discussed above. The channel widths of field effect transistors 131 and 132 are selected for the drive required for the gates of field effect transistors 135, 136 and 137. Note that in the preferred embodiment bias generator 130 was constructed of available field effect transistors in a gate array device. The relative channel widths of Table 1 represent the best obtainable based upon the design considerations and the available devices.

What is claimed is:

1. A bias generator for a bitline in a column multiplexed memory comprising:
   a P-channel field effect transistor having a source-drain path connected between a supply voltage and a bitline, and a gate;
   an N-channel field effect transistor having a source-drain path connected between a ground voltage and a bitline, and a gate; and
   a biasing circuit for
      connecting said gate of said P-channel field effect transistor to the bitline and said gate of said N-channel field effect transistor to the bitline for a pre-write interval, and
      connecting said gate of said P-channel field effect transistor to the supply voltage and said gate of said N-channel field effect transistor to ground for times other than said pre-write interval.

2. The bias generator of claim 1, wherein:
   said biasing circuit includes
      an input terminal receiving a bias enable pulse active during said pre-write interval,
      an inverter having an input connected to said input terminal and an output,
      a second P-channel field effect transistor having a source-drain path connected between the supply voltage and said gate of said P-channel field effect transistor, and a gate connected to said output of said inverter,
      a second N-channel field effect transistor having a source-drain path connected between said gate of said P-channel field effect transistor and the bitline, and a gate connected to said output of said inverter,
      a third N-channel field effect transistor having a source-drain path connected between the bitline and said gate of said N-channel field effect transistor, and a gate connected to said output of said inverter,
      a fourth N-channel field effect transistor having a source-drain path connected between said gate of said N-channel field effect transistor and ground, and a gate connected to said input terminal.

3. The bias generator of claim 2, wherein:
   a channel width of said second P-channel field effect transistor and a channel width of said fourth N-channel field effect transistor are selected for equal turn off slew of said P-channel field effect transistor and said N-channel field effect transistor.

4. The bias generator of claim 2, wherein:
   said third N-channel field effect transistor has a channel width much greater than a channel width of said fourth N-channel field effect transistor.

5. The bias generator of claim 1, wherein:
   a ratio between a channel width of said P-channel field effect transistor and a channel width of said N-channel field effect transistor equals a predetermined ratio corresponding to ratio between a channel width of said P-channel field effect transistor and a channel width of said N-channel field effect transistor of an inverter within a latch of a memory cell.

6. A column multiplexed memory comprising:
   a plurality of memory cells disposed in rows and columns, each memory cell having a latch consisting of a pair of cross-connected inverters for storing a data bit, a write bitline input for receiving data to be written into said latch and at least one write wordline input enabling writing into said latch;
   a plurality of write wordlines, each write wordline connected to said at least one write wordline input of each memory cell in a corresponding row of memory cells;
   a plurality of write bitlines, each write bitline connected to said write bitline input of each memory cell of a column of memory cells;

a word address decoder connected to each of said wordlines and receiving a predetermined set of most significant bits of a memory address, said word address decoder activating said word address lines connected to a single row of said memory cells corresponding to said predetermined set of most significant bits of said memory address;

at least one column selector, each column selector connected to plural write bitlines and receiving a predetermined set of least significant bits of said memory address, each column selector coupling a write data input to said write bitline corresponding to said predetermined set of least significant bits of said memory address during a write interval; and at least one bias generator corresponding to each column selector, each bias generator connected to said plural write bitlines connected to said corresponding column selector, said bias generator including an input terminal receiving a bias enable pulse active during a pre-write interval immediately prior to said write interval, a first P-channel field effect transistor having a source-drain path connected between a supply voltage and a bitline not corresponding to said predetermined set of least significant bits of said memory address, and a gate, an first N-channel field effect transistor having a source-drain path connected between a ground voltage and said bitline, and a gate, an inverter having an input connected to said input terminal and an output, a second P-channel field effect transistor having a source-drain path connected between the supply voltage and said gate of said P-channel field effect transistor, and a gate connected to said output of said inverter, a second N-channel field effect transistor having a source-drain path connected between said gate of said P-channel field effect transistor and said bitline, and a gate connected to said output of said inverter, a third N-channel field effect transistor having a source-drain path connected between said bitline and said gate of said N-channel field effect transistor, and a gate connected to said output of said inverter, a fourth N-channel field effect transistor having a source-drain path connected between said gate of said N-channel field effect transistor and ground, and a gate connected to said input terminal.

7. The column multiplexed memory of claim 6, wherein:

a channel width of said second P-channel field effect transistor and a channel width of said fourth N-channel field effect transistor are selected for equal turn off slew of said first P-channel field effect transistor and said first N-channel field effect transistor.

8. The column multiplexed memory of claim 7, wherein:

said third N-channel field effect transistor has a channel width much greater than a channel width of said fourth N-channel field effect transistor.

9. The column multiplexed memory of claim 6, wherein:

a ratio between a channel width of said first P-channel field effect transistor and a channel width of said first N-channel field effect transistor equals a predetermined ratio corresponding to a ratio between a channel width of said P-channel field effect transistor and a channel width of said N-channel field effect transistor of an input inverter of said cross-connected inverters within said memory cell.

* * * * *